United States Patent
Kamiya et al.

(10) Patent No.: US 10,768,066 B2
(45) Date of Patent: Sep. 8, 2020

(54) PIEZOELECTRIC SENSOR INCLUDING OVERLAPPING CUTOUT SECTIONS IN A SIGNAL ELECTRODE, A FIRST GROUND ELECTRODE, AND A SECOND ELECTRODE

(71) Applicant: SEKISUI CHEMICAL CO., LTD., Osaka (JP)

(72) Inventors: Nobuto Kamiya, Osaka (JP); Bungo Hatta, Osaka (JP); Takazumi Okabayashi, Osaka (JP); Naoyuki Morimoto, Osaka (JP); Yoshiaki Tamai, Saitama (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/902,964

(22) PCT Filed: Jul. 4, 2014

(86) PCT No.: PCT/JP2014/067902
§ 371 (c)(1),
(2) Date: Jan. 5, 2016

(87) PCT Pub. No.: WO2015/005238
PCT Pub. Date: Jan. 15, 2015

(65) Prior Publication Data
US 2016/0153860 A1    Jun. 2, 2016

(30) Foreign Application Priority Data

Jul. 10, 2013  (JP) .................. 2013-144211
Jul. 10, 2013  (JP) .................. 2013-144215
Sep. 30, 2013  (JP) .................. 2013-203029

(51) Int. Cl.
| | |
|---|---|
| *G01L 9/08* | (2006.01) |
| *H01L 41/113* | (2006.01) |
| *G01P 15/09* | (2006.01) |
| *H01L 41/047* | (2006.01) |

(52) U.S. Cl.
CPC .............. *G01L 9/08* (2013.01); *G01P 15/09* (2013.01); *H01L 41/047* (2013.01); *H01L 41/0475* (2013.01); *H01L 41/1132* (2013.01)

(58) Field of Classification Search
CPC ....................................................... G01L 9/08
(Continued)

(56) References Cited

U.S. PATENT DOCUMENTS

2006/0144154 A1 * 7/2006 Ueno ............. G01L 1/16 73/723
2009/0009977 A1   1/2009 Enomoto et al.
(Continued)

FOREIGN PATENT DOCUMENTS

| CN | 101784874 | 7/2010 | |
|---|---|---|---|
| JP | 10-332509 | 12/1998 | |
| JP | 2008122215 A * | 5/2008 | |
| JP | 5044196 | 10/2012 | |
| WO | 2006/080298 | 8/2006 | |
| WO | WO 2008059751 A1 * | 5/2008 | ............ G01L 1/16 |

OTHER PUBLICATIONS

International Search Report dated Jul. 29, 2014 in International Application No. PCT/JP2014/067902.
(Continued)

*Primary Examiner* — Andre J Allen
(74) *Attorney, Agent, or Firm* — Wenderoth, Lind & Ponack, L.L.P.

(57) ABSTRACT

A piezoelectric sensor including: a piezoelectric sheet; a first ground electrode integrally laminated on a first side of the piezoelectric sheet and having a first cutout section; a signal electrode integrally laminated on a second side of the piezoelectric sheet and having a third cutout section; and a second ground electrode integrally laminated on the signal electrode so as to be electrically insulated from the signal electrode and having a second cutout section. The cutout sections of the signal electrode, the first ground electrode, and the second ground electrode are at least partially over-
(Continued)

lapped with one another in a thickness direction of the piezoelectric sheet. A portion of the piezoelectric sheet exposed from a portion where the cutout sections of the signal electrode, the first ground electrode, and the second ground electrode are overlapped with one another serves as an exposed section.

9 Claims, 15 Drawing Sheets

(58) Field of Classification Search
USPC .................................................. 73/702–704
See application file for complete search history.

(56) References Cited

U.S. PATENT DOCUMENTS

| | | | |
|---|---|---|---|
| 2010/0253183 A1* | 10/2010 | Ando | G01L 1/16 310/338 |
| 2016/0027988 A1* | 1/2016 | Nagahata | H01L 41/0472 347/70 |
| 2016/0124560 A1* | 5/2016 | Watazu | H01L 41/0478 345/173 |

OTHER PUBLICATIONS

Extended European Search Report dated Feb. 7, 2017 in corresponding European Patent Application No. 14822553.5.

* cited by examiner

PIEZOELECTRIC SENSOR INCLUDING OVERLAPPING CUTOUT SECTIONS IN A SIGNAL ELECTRODE, A FIRST GROUND ELECTRODE, AND A SECOND ELECTRODE

TECHNICAL FIELD

The present invention relates to a piezoelectric sensor capable of maintaining an excellent piezoelectric property over a long period.

BACKGROUND ART

Vital signal sensors employing piezoelectric sheets as sensors have been known. When a pressure generated by a pulse wave, a respiration, or a body motion is applied on the piezoelectric sheet, an electrical signal having a size corresponding to the pressure is generated from the piezoelectric sheet. A vital signal can be detected through the use of this electrical signal.

Patent Literature 1 discloses a piezoelectric sensor including: a piezoelectric body made from a macromolecular material; a first electrode supporting section being disposed on one side of the piezoelectric body and supporting a signal electrode on a first insulator; and a second electrode supporting section being disposed on the other side of the piezoelectric body and supporting a ground electrode on a second insulator. In the piezoelectric sensor, the signal electrode is confined within a region of the piezoelectric body as viewed in a direction in which the piezoelectric body, the first electrode supporting section, and the second electrode supporting section are overlapped with one another, and the entire piezoelectric body is confined within a region of the ground electrode or disposed so as to overlap the region of the ground electrode.

CITATION LIST

Patent Literature

Patent Literature 1: Japanese Patent No. 5044196 Summary of Invention

Technical Problem

However, the piezoelectric body which constitutes the above-described piezoelectric sensor is sealed by a fixative as shown in FIG. 1 in Patent Literature 1, for example. Such a fixative is typically formed by a pressure sensitive adhesive. Upon manufacturing the piezoelectric sensor, the piezoelectric sheet, the signal electrode, and the ground electrode are integrally laminated with one another by applying a pressure sensitive adhesive containing a solvent to component parts and then causing the solvent contained in the pressure sensitive adhesive to be evaporated and removed.

The piezoelectric sheet, on the other hand, is typically formed from a synthetic resin. Since the synthetic resin allows water vapor or a gaseous organic compound to be transmitted therethrough, there may be a risk that the water vapor or the gaseous organic compound is penetrated into the piezoelectric sheet during the manufacturing of the piezoelectric sensor. Such penetration of the water vapor or the gaseous organic compound into the piezoelectric sheet leads to a problem in which the piezoelectric property of the piezoelectric sheet deteriorates.

When the pressure sensitive adhesive containing a solvent is used, the solvent in the pressure sensitive adhesive may be penetrated into the piezoelectric sheet during the manufacturing of the piezoelectric sensor, or a residual monomer contained in the pressure sensitive adhesive may be penetrated into the piezoelectric sheet during the manufacturing of the piezoelectric sensor. Once such a solvent, a residual monomer, or the like is penetrated into the piezoelectric sheet, the solvent or the residual monomer penetrated into the piezoelectric sheet cannot be released and removed from the piezoelectric sheet because the piezoelectric sheet which constitutes the piezoelectric sensor of Patent Literature 1 is sealed by the fixative as described above. As a result, there arises a problem in which the piezoelectric property of the piezoelectric sheet is deteriorated.

Moreover, the pressure sensitive adhesive which constitutes the fixative is often an acrylic pressure sensitive adhesive. Since the acrylic pressure sensitive adhesive has polarity, the acrylic pressure sensitive adhesive has a property easy to contain water vapor, which may lead to the penetration of the water vapor into the piezoelectric sheet by the intermediary of the fixative. Also in this case, the water vapor penetrated into the piezoelectric sheet cannot be released and removed from the piezoelectric sheet, which leads to a problem in which the piezoelectric property of the piezoelectric sheet deteriorates.

The present invention provides a piezoelectric sensor that maintains an excellent piezoelectric property over a long period substantially without causing a deterioration in the piezoelectric property due to the penetration of water vapor, a solvent, or a residual monomer, for example.

Means for Solving Problem

A first piezoelectric sensor of the present invention includes: a piezoelectric sheet;
a first ground electrode integrally laminated on a first side of the piezoelectric sheet and having a first cutout section;
a signal electrode integrally laminated on a second side of the piezoelectric sheet and having a third cutout section; and
a second ground electrode integrally laminated on the signal electrode so as to be electrically insulated from the signal electrode and having a second cutout section, wherein
the cutout sections of the signal electrode, the first ground electrode, and the second ground electrode are at least partially overlapped with one another in a thickness direction of the piezoelectric sheet, and
a portion of the piezoelectric sheet exposed through a portion where the cutout sections of the signal electrode, the first ground electrode, and the second ground electrode are overlapped with one another in the thickness direction of the piezoelectric sheet serves as an exposed section.

A second piezoelectric sensor of the present invention is characterized in that the second ground electrode is integrally laminated on the second side of the piezoelectric sheet by adhesively integrating a second ground electrode sheet, formed by integrally laminating a second electrical insulation sheet, the second ground electrode, and a second fixative layer with one another in this order, with the second side of the piezoelectric sheet by the second fixative layer,
that the signal electrode is integrally laminated on the signal electrode by adhesively integrating a signal electrode sheet, formed by integrally laminating a third electrical insulation sheet, the signal electrode, and a third fixative layer with one another in this order, with the second ground electrode sheet by the third fixative layer, and that a fourth electrical insulation sheet is interposed between the signal electrode sheet and the second ground electrode sheet in a portion where an end face of the signal electrode sheet intersects with an end face of the second ground electrode sheet.

A third piezoelectric sensor of the present invention is characterized in that the first cutout section of the first ground electrode, the second cutout section of the second ground electrode, and part of the signal electrode are at least partially overlapped with one another in the thickness direction of the piezoelectric sheet and this overlapped portion serves as a signal electrode connecting section, that the third cutout section of the signal electrode, part of the first ground electrode, and part of the second ground electrode are at least partially overlapped with one another in the thickness direction of the piezoelectric sheet and this overlapped portion serves as a ground electrode connecting section; and that the piezoelectric sensor further includes:

a signal electrode piercing terminal having a claw stuck into the signal electrode connecting section so as to be electrically connected to the signal electrode and a protruded connecting section protruding outward from a peripheral edge of the piezoelectric sheet, and a ground electrode piercing terminal having a claw stuck into the ground electrode connecting section so as to be electrically connected to the first ground electrode and the second ground electrode and a protruded connecting section protruding outward from the peripheral edge of the piezoelectric sheet.

Advantageous Effects of Invention

Due to the above-described configuration of the first piezoelectric sensor, the piezoelectric sensor is provided with the exposed section formed without being covered by the ground electrodes and the signal electrode and with the both sides thereof being exposed to the ambient air even if water vapor, a solvent, a residual monomer, and the like are penetrated into the piezoelectric sheet which constitutes the piezoelectric sensor during the manufacturing of the piezoelectric sensor. Impurity compounds such as the water vapor, the solvent, and the residual monomer, penetrated into the piezoelectric sheet, can be smoothly released from the piezoelectric sheet through both the sides of the exposed section. Thus, the piezoelectric sensor of the present invention maintains an excellent piezoelectric property over a long period substantially without causing a deterioration in the piezoelectric property due to the penetration of a gas into the piezoelectric sheet thereof.

Due to the above-described configuration, the second piezoelectric sensor can be efficiently manufactured with the simple step of adhesively integrating the signal electrode sheet, and the first and second ground electrode sheets with the piezoelectric sheet.

Furthermore, in the second piezoelectric sensor, the fourth electrical insulation sheet is interposed between the signal electrode sheet and the second ground electrode sheet in the portion where the end face of the signal electrode sheet intersects with the end face of the second ground electrode sheet. Thus, a potential generated in the piezoelectric sheet can be stably taken out through the signal electrode without unexpectedly developing a short circuit between the signal electrode and the second ground electrode.

Due to the above-described configuration, the third piezoelectric sensor allows a conductive wire to be easily electrically connected to the piezoelectric sheet without damaging the piezoelectric sheet.

When a surface of the protruded connecting section in the signal electrode piercing terminal and the ground electrode piercing terminal (hereinafter, sometimes collectively referred to simply as a "piercing terminal") closer to the piezoelectric sheet is used as a conductive wire connecting surface to be connected with the conductive wire in the above-described piezoelectric sheet, the use of solder on the conductive wire connecting surface in the protruded connecting section of the piercing terminal allows easy connection of the conductive wire to the electrode piercing terminal while reducing the thickness of the piezoelectric sensor as much as possible and thus achieves a size reduction in the piezoelectric sensor.

When gripping pieces for gripping the conductive wire connected to the conductive wire connecting surface are formed in the protruded connecting section in the signal electrode piercing terminal and the ground electrode piercing terminal in the above-described piezoelectric sensor, the conductive wire can be reliably fixed to the conductive wire connecting surface with the gripping pieces gripping the conductive wire, and a more reliable piezoelectric sensor can be therefore obtained.

DESCRIPTION OF EMBODIMENTS

Figure 1:
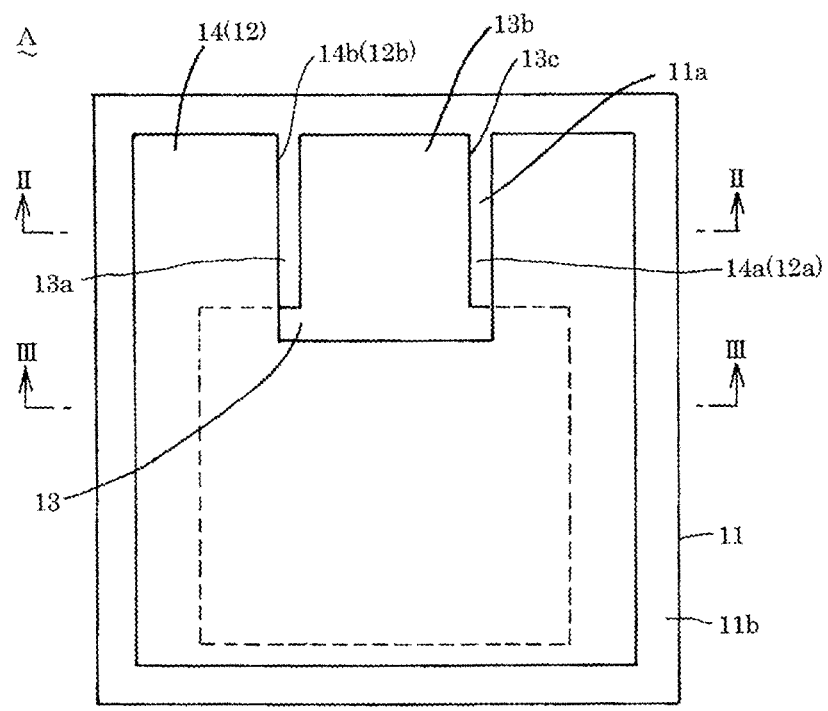
FIG. 1 is a plan view illustrating a piezoelectric sensor of the present invention.
Figure 2:
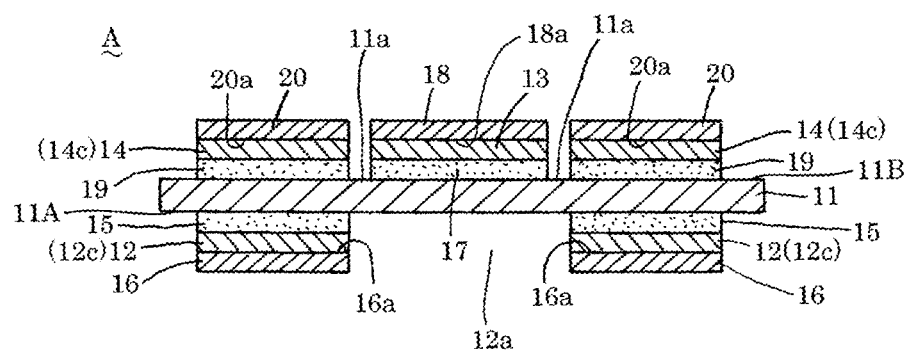
FIG. 2 is a cross-sectional view taken along line II-II in FIG. 1.

An example of a piezoelectric sensor of the present invention will be described with reference to the drawings. As shown in FIGS. 1 to 5, a piezoelectric sensor A includes: a piezoelectric sheet 11; a first ground electrode 12 integrally laminated on a first side of the piezoelectric sheet 11; a signal electrode 13 integrally laminated on a second side of the piezoelectric sheet 11; and a second ground electrode 14 integrally laminated on the above-described signal electrode 13.

The piezoelectric sheet 11 is not limited to a particular sheet so long as the sheet is capable of generating electric charges on a surface thereof under application of external force (sheet having a piezoelectric phenomenon). Examples of the piezoelectric sheet 11 include: a piezoelectric sheet in which polarization is imparted to a synthetic resin sheet (synthetic resin foamed sheet or synthetic resin non-foamed sheet); a piezoelectric sheet in which polarization is imparted to an inorganic sheet where an inorganic piezoelectric material is dispersed in a resin; and a piezoelectric sheet in which polarization is imparted to an inorganic sheet including an inorganic piezoelectric material. The piezoelectric sheet in which polarization is imparted to a synthetic resin sheet (synthetic resin foamed sheet or synthetic resin non-foamed sheet) is preferable and the piezoelectric sheet in which polarization is imparted to a synthetic resin foamed sheet is more preferable because such a sheet can detect a faint vital signal such as a pulse wave with high accuracy, has high sensitivity, and can easily generate electric charges in response to deformation in a thickness direction thereof.

The synthetic resin which constitutes the synthetic resin sheet is not limited to a particular synthetic resin. Examples of the synthetic resin include: a polyolefin-based resin such as a polyethylene-based resin and a polypropylene-based resin; polyvinylidene fluoride; polylactic acid; and a liquid crystal resin. Examples of the inorganic material which constitutes the inorganic sheet include: lead zirconate titanate; lead titanate; potassium niobate; lithium niobate; lithium tantalate; sodium tungstate; zinc oxide; lithium tetraborate; $Ba_2NaNb_5O_5$; and $Pb_2KNb_5O_{15}$.

A method of imparting polarization to a synthetic resin sheet or an inorganic sheet is not limited to a particular method. Examples of such a method include: (1) a method of imparting polarization to a synthetic resin sheet or an inorganic sheet by interposing the synthetic resin sheet or the inorganic sheet between a pair of plate electrodes, connecting the plate electrode in contact with a surface to be charged to a high-voltage direct-current power supply while grounding the other plate electrode, and applying a direct current or pulsed high voltage to the synthetic resin sheet or the inorganic sheet to inject electric charges into the synthetic resin or the inorganic material; (2) a method of imparting polarization to a synthetic resin or inorganic sheet by irradiating a surface of the synthetic resin sheet or the inorganic sheet with ionizing radiation, such as electron beams or X rays, or ultraviolet rays to ionize air molecules near the synthetic resin sheet or the inorganic sheet; and (3) a method of imparting polarization to a synthetic resin or inorganic sheet by overlapping a grounded plate electrode in close contact with a first side of the synthetic resin sheet or the inorganic sheet, arranging needle electrodes or wire electrodes electrically connected to a direct-current high-voltage power supply on a second side of the synthetic resin sheet or the inorganic sheet with a predetermined distance away therefrom, causing corona discharge by a concentrated electric field near the tip of the needle electrode or the surface of the wire electrode to ionize air molecules, and causing air ions generated by the polarity of the needle electrodes or the wire electrodes to repel each other.

A first electrical insulation sheet 16 is integrally laminated on a first side 11A of the piezoelectric sheet 11 by the intermediary of a first fixative layer 15 in an area excluding an outer periphery of the first side 11A. A third electrical insulation sheet 18 is integrally laminated on a second side 11B of the piezoelectric sheet 11 by the intermediary of a third fixative layer 17 in an area excluding an outer periphery of the second side 11B. A second electrical insulation sheet 20 is integrally laminated on the third electrical insulation sheet 18 by the intermediary of a second fixative layer 19. Note that the electrical insulation sheets 16, 18, and 20 are not limited to a particular sheet so long as they have an electrical insulation property. Examples of the electrical insulation sheets 16, 18, and 20 include a polyethylene terephthalate sheet, a polyethylene naphthalate sheet, and a polyvinyl chloride sheet.

The fixative which constitutes the fixative layer is composed of a reactive, solvent, water-based, or hot-melt adhesive or pressure sensitive adhesive. A fixative having a low dielectric constant is preferable in view of maintaining the sensitivity of the piezoelectric sheet 11.

The first ground electrode 12 is integrally formed on the entire surface of a side 16a of the first electrical insulation sheet 16 closer to the piezoelectric sheet 11. The above-described first fixative layer 15 is integrally formed on the entire surface of the first ground electrode 12.

The signal electrode 13 is integrally formed on the entire surface of a side 18a of the third electrical insulation sheet 18 closer to the piezoelectric sheet 11. The above-described third fixative layer 17 is integrally formed on the entire surface of the signal electrode 13.

The second ground electrode 14 is integrally formed on the entire surface of a side 20a of the second electrical insulation sheet 20 closer to the piezoelectric sheet 11. The above-described second fixative layer 19 is integrally formed on the entire surface of the second ground electrode 14.

The first ground electrode 12 is integrally laminated on the first side 11A of the piezoelectric sheet 11 by the intermediary of the first fixative layer 15. The first electrical insulation sheet 16 is integrally laminated on the first ground electrode 12.

Figure 3:
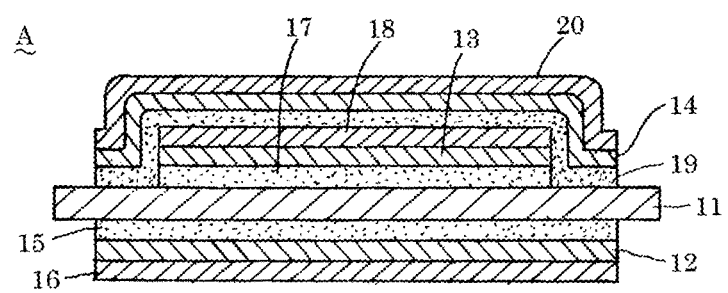
FIG. 3 is a cross-sectional view taken along line in FIG. 1.
Figure 4:
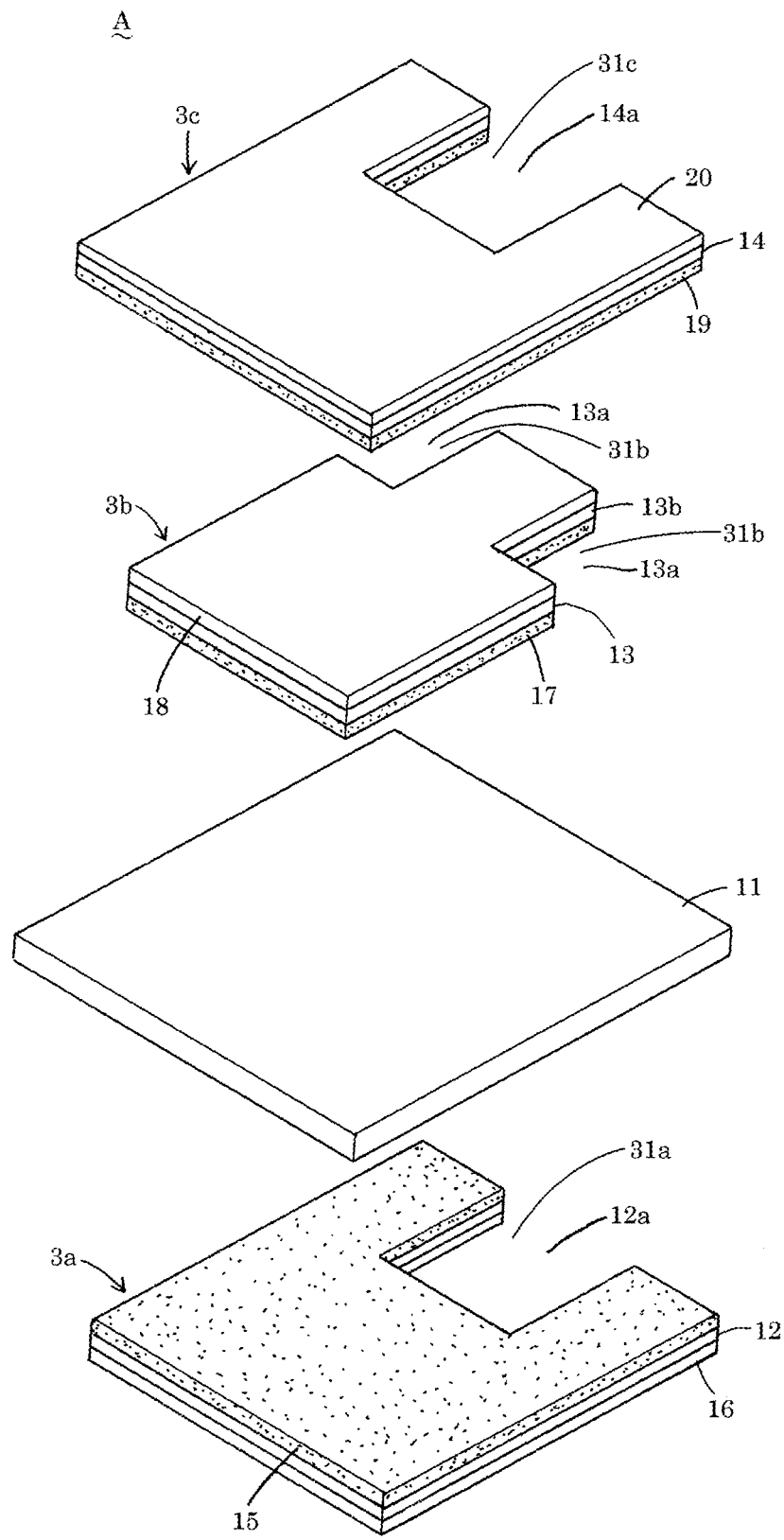
FIG. 4 is an exploded perspective view of the piezoelectric sensor in FIG. 1.
Figure 5:
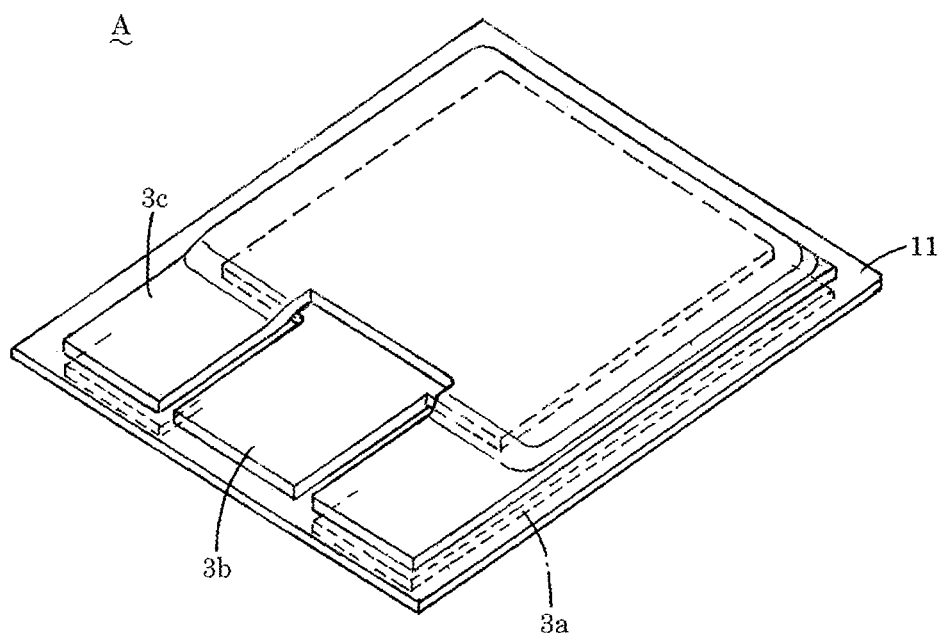
FIG. 5 is a perspective view illustrating the piezoelectric sensor in FIG. 1.
Figure 6:
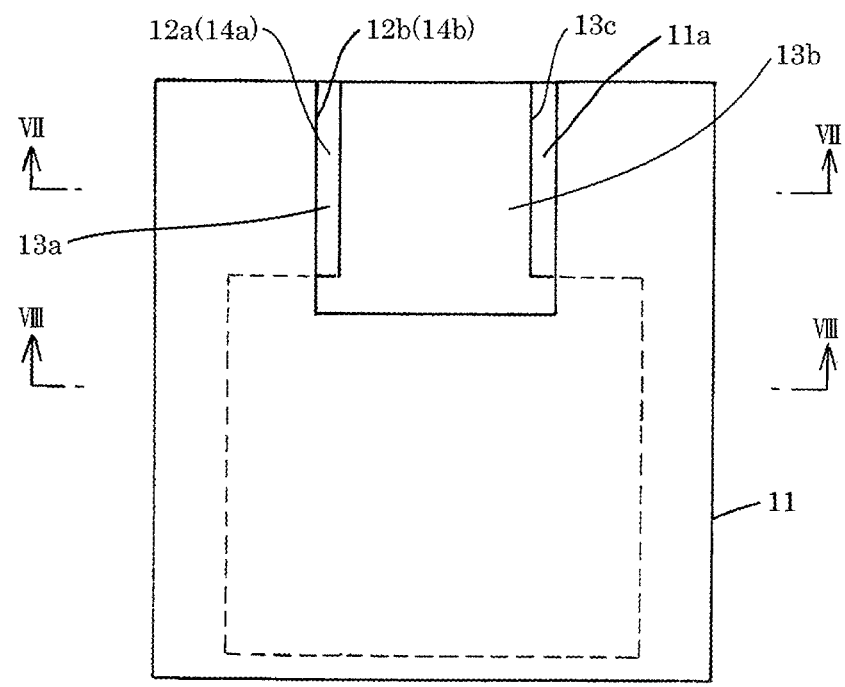
FIG. 6 is a plan view illustrating another example of the piezoelectric sensor of the present invention.
Figure 7:
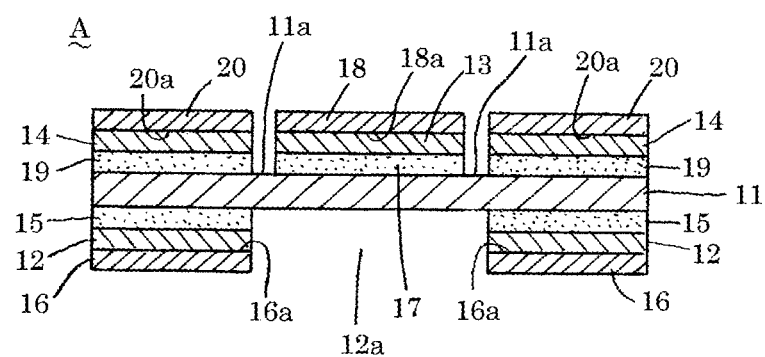
FIG. 7 is a cross-sectional view taken along line VII-VII in FIG. 6.
Figure 8:
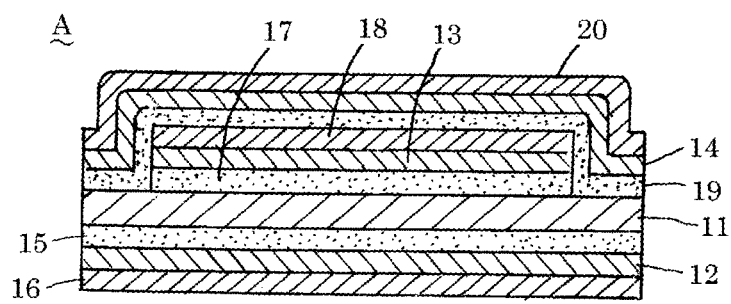
FIG. 8 is a cross-sectional view taken along line VIII-VIII in FIG. 6.
Figure 9:
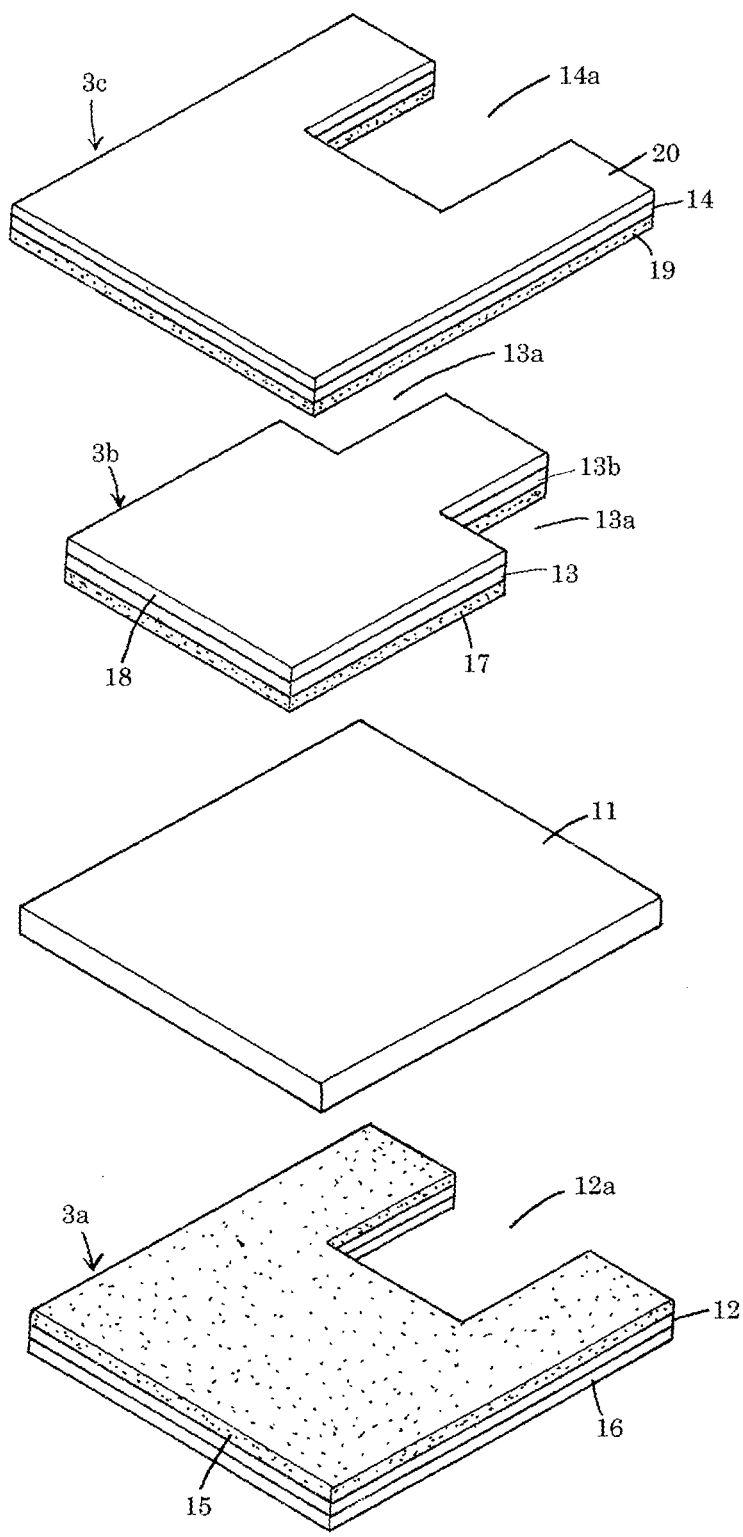
FIG. 9 is an exploded perspective view of the piezoelectric sensor in FIG. 6.

As shown in FIG. 3, the signal electrode 13 is integrally laminated on the second side 11B of the piezoelectric sheet 11 by the intermediary of the third fixative layer 17. The third electrical insulation sheet 18 is integrally laminated on the signal electrode 13. Furthermore, the second ground electrode 14 is integrally laminated on the third electrical insulation sheet 18 by the intermediary of the second fixative layer 19. The second electrical insulation sheet 20 is integrally laminated on the second ground electrode 14. The signal electrode 13 and the second ground electrode 14 are electrically insulated from each other by the third electrical insulation sheet 18.

As viewed in the thickness direction of the piezoelectric sheet 11, the first electrical insulation sheet 16, the first ground electrode 12, and the first fixative layer 15 are formed in the same shape and the same size; the third electrical insulation sheet 18, the signal electrode 13, and the third fixative layer 17 are formed in the same shape and the same size; and the second electrical insulation sheet 20, the second ground electrode 14, and the second fixative layer 19 are formed in the same shape and the same size.

Examples of a method of forming an electrode on an electrical insulation sheet include: (1) a method in which conductive paste prepared by including conductive microparticles in a binder is applied and dried on an electrical insulation sheet; (2) a method of forming an electrode on an electrical insulation sheet by means of vapor deposition; and (3) a method in which a metal sheet as an electrode such as copper foil or aluminum foil is integrally laminated on an electrical insulation sheet.

As shown in FIG. 1, the first and second ground electrodes 12 and 14 integrally laminated on the first side 11A of the piezoelectric sheet 11 having a rectangular plane shape are formed in a size smaller than the piezoelectric sheet 11 as viewed in the thickness direction of the piezoelectric sheet 11. A peripheral edge of the piezoelectric sheet 11 protrudes outward from a region occupied by the first and second ground electrodes 12 and 14 and the signal electrode 13 as viewed in the thickness direction of the piezoelectric sheet 11.

The first ground electrode 12 is formed in a generally-rectangular plane shape. In a portion of a rectangular shape other than four corners thereof, the first ground electrode 12 has a first cutout section 12a having a rectangular plane shape opened to a peripheral edge of the rectangular shape. A cutout section is formed in each of the first electrical insulation sheet 16 and the first fixative layer 15 in a portion corresponding to the projection of the first cutout section 12a of the first ground electrode 12 in the thickness direction. The first electrical insulation sheet 16 and the first fixative layer 15 each have a plane shape with the same shape and the same size as the first ground electrode 12. Also, the second ground electrode 14 is formed in a generally-rectangular plane shape. In a portion of a rectangular shape other than four corners thereof, the second ground electrode 14 has a second cutout section 14a having a rectangular plane shape opened to a peripheral edge of the rectangular shape. A cutout section is formed in each of the second electrical insulation sheet 20 and the second fixative layer 19 in a portion corresponding to the projection of the second cutout section 14a of the second ground electrode 14 in the thickness direction. The second electrical insulation sheet 20 and the second fixative layer 19 each have a plane shape with the same shape and the same size as the second ground electrode 14. While FIGS. 1 to 5 show a case where the first ground electrode 12 and the second ground electrode 14 are formed in the same size and the same shape, the first ground electrode 12 and the second ground electrode 14 may have different sizes or different shapes so long as the first cutout section 12a of the first ground electrode 12 and the second cutout section 14a of the second ground electrode 14 are entirely or partially overlapped with each other as viewed in the thickness direction of the piezoelectric sheet 11. The rectangular shape includes a square shape.

The shape of the signal electrode 13 is smaller than a region occupied by the first ground electrode 12, the second ground electrode 14, the first cutout section 12a, and the second cutout section 14a as viewed in the thickness direction of the piezoelectric sheet 11. The signal electrode 13 is formed in a generally-rectangular plane shape. The signal electrode 13 has third cutout sections 13a, 13a formed by cutting out a pair of adjacent corners in the rectangular shape. A protrusion 13b having a rectangular plane shape is formed between the third cutout sections 13a, 13a of the signal electrode 13. Cutout sections are formed in each of the third electrical insulation sheet 18 and the third fixative layer 17 in portions corresponding to the projection of the third cutout sections 13a, 13a of the signal electrode 13 in the thickness direction of the piezoelectric sheet 11. The third electrical insulation sheet 18 and the third fixative layer 17 each have a plane shape with the same shape and the same size with the signal electrode 13.

The first ground electrode 12 and the second ground electrode 14 are respectively integrally laminated on portions excluding the outer peripheries on both the sides of the piezoelectric sheet 11 while being overlapped with each other in the thickness direction of the piezoelectric sheet 11. The first cutout section 12a of the first ground electrode 12 and the second cutout section 14a of the second ground electrode 14 are overlapped with each other in the thickness direction of the piezoelectric sheet 11. Although it is only required that the first cutout section 12a of the first ground electrode 12 and the second cutout section 14a of the second ground electrode 14 are partially overlapped with each other, complete overlapping therebetween is preferable.

Moreover, the signal electrode 13 is integrally laminated on the second side 11B of the piezoelectric sheet 11. As viewed in the thickness direction of the piezoelectric sheet 11, the protrusion 13b of the signal electrode 13 is accommodated in an overlapped portion between the first cutout section 12a of the first ground electrode 12 and the second cutout section 14a of the second ground electrode 14. Note that the entire signal electrode 13 is arranged within the region occupied by the first and second ground electrodes 12 and 14 and their cutout sections 12a and 14a as viewed in the thickness direction of the piezoelectric sheet 11. As viewed in the thickness direction of the piezoelectric sheet 11, the cutout sections 13a, 13a of the signal electrode 13 are arranged at positions corresponding to corners 12c and 14c adjacent to the cutout sections 12a and 14a of the first ground electrode 12 and the second ground electrode 14.

As viewed in the thickness direction of the piezoelectric sheet 11, the first cutout section 12a of the first ground electrode 12 and the second cutout section 14a of the second ground electrode 14 are partially overlapped with the cutout sections 13a, 13a of the signal electrode 13. In other words, gaps are formed between edges 12b and 14b of the cutout sections 12a and 14a of the first and second ground electrodes 12 and 14 and a peripheral edge 13c of the protrusion 13b of the signal electrode 13. As viewed in the thickness direction of the piezoelectric sheet 11, a cutout section having the same shape and the same size with the first cutout section 12a of the first ground electrode 12 is formed also in each of the first electrical insulation sheet 16 and the first fixative layer 15. As viewed in the thickness direction of the piezoelectric sheet 11, a cutout section having the same shape and the same size with the first cutout section 14a of the second ground electrode 14 is formed also in each of the second electrical insulation sheet 20 and the second fixative layer 19. As viewed in the thickness direction of the piezoelectric sheet 11, cutout sections having the same shape and the same size with the third cutout sections 13a of the signal electrode 13 are formed also in each of the third electrical insulation sheet 18 and the third fixative layer 17. Thus, part of the piezoelectric sheet 11 is exposed through the above-described gaps in a state in contact with the ambient air without being covered by the electrical insulation sheets 16, 18, and 20, the first and second ground electrodes 12 and 14, the signal electrode 13, and the fixative layers 15, 17, and 19. Such an exposed portion serves as an exposed section 11*a*. The exposed section 11*a* of the piezoelectric sheet 11 is exposed in a state in contact with the ambient air without both the sides thereof being covered by the first and second ground electrodes 12 and 14, the signal electrode 13, the electrical insulation sheets 16, 18, and 20, and the fixative layers 15, 17, and 19.

Impurity compounds, such as water vapor, an organic solvent and a residual monomer in a pressure sensitive adhesive, entering into the piezoelectric sheet 11 during the manufacturing of the piezoelectric sensor A can be smoothly released into the atmosphere from both the sides of the piezoelectric sheet 11 through the exposed sections 11*a* of the piezoelectric sheet 11 and an amount of gas contained in the piezoelectric sheet 11 can be reduced in a short period of time. Therefore, an excellent piezoelectric property of the piezoelectric sheet can be achieved and such an excellent piezoelectric property can be maintained over a long period. In this manner, the exposed sections 11*a* of the piezoelectric sheet 11 allow impurity compounds in the piezoelectric sheet 11 to be smoothly released from both the sides thereof into the atmosphere. Consequently, unlike a case where such impurity compounds in the piezoelectric sheet are released only from one side of the piezoelectric sheet, the impurity compounds can be smoothly released and removed from the piezoelectric sheet in a short period of time wherever the impurity compounds in the piezoelectric sheet exist in the thickness direction of the piezoelectric sheet.

Furthermore, in the above-described piezoelectric sensor A, the outer periphery of the piezoelectric sheet 11 protrudes outward from the region occupied by the first and second ground electrodes 12 and 14 and the cutout sections 12*a* and 14*a* as viewed in the thickness direction of the piezoelectric sheet 11. Such a protruded portion serves as an exposed protrusion 11*b* of the piezoelectric sheet 11. The exposed protrusion 11*b* is also in contact with the ambient air without being covered by the electrical insulation sheets 16, 18, and 20, the first and second ground electrodes 12 and 14, the signal electrode 13, and the fixative layers 15, 17, and 19. Thus, impurity compounds entering into the piezoelectric sheet 11 can be released into the atmosphere also from the exposed protrusion 11*b* of the piezoelectric sheet 11 and an amount of impurity compounds included in the piezoelectric sheet 11 can thereby be reduced.

Moreover, the third cutout sections 13*a* of the signal electrode 13 are positioned at portions corresponding to the corners 12*c* and 14*c* adjacent to the cutout sections 12*a* and 14*a* of the first ground electrode 12 and the second ground electrode 14 as viewed in the thickness direction of the piezoelectric sheet 11, and no signal electrode 13 is arranged in these portions. Such portions serve as ground electrode connecting sections A2, A2 for connecting a conductive wire to the first ground electrode 12 and the second ground electrode 14.

As viewed in the thickness direction of the piezoelectric sheet 11, the cutout sections 12*a* and 14*a* of the first ground electrode 12 and the second ground electrode 14 are positioned at a portion corresponding to the protrusion 13*b* of the signal electrode 13, and therefore no second ground electrode 12 and second ground electrode 14 are arranged in this portion. This portion serves as a signal electrode connecting section A1 for connecting a conductive wire to the signal electrode 13.

In order to use the above-described piezoelectric sensor A, a conductive wire is electrically connected to the first ground electrode 12 in the ground electrode connecting section A2. Examples of a method of electrically connecting a conductive wire to the first ground electrode 12 include a method in which a piercing terminal is driven into the first ground electrode 12 and the second ground electrode 14 in the ground electrode connecting section A2 so as to electrically connect the first and second ground electrodes 12 and 14 to each other without being electrically connected to the signal electrode 13, and a conductive wire is electrically connected to the first and second ground electrodes 12 and 14 by the intermediary of the piercing terminal. The first ground electrode 12 is set as a reference electrode by grounding the first ground electrode 12 by the intermediary of the conductive wire connected to the first ground electrode 12.

In the signal electrode connecting section A1, on the other hand, a conductive wire is electrically connected to the protrusion 13*b* of the signal electrode 13. Examples of a method of electrically connecting a conductive wire to the protrusion 13*b* of the signal electrode 13 include a method in which a piercing terminal is driven into the protrusion 13*b* of the signal electrode 13 in the signal electrode connecting section A1 so as to electrically connect a conductive wire to the signal electrode 13 by the intermediary of the piercing terminal without electrically connecting the first and second ground electrodes 12 and 14 to the signal electrode 13.

Then, a potential generated in the piezoelectric sheet 11 can be drawn out through the signal electrode 13 with the first ground electrode 12 used as a reference electrode.

How to electrically connect a conductive wire to the piezoelectric sensor A with a general-purpose piercing terminal has been described in the above. It is preferable that a signal electrode piercing terminal 5*a* and a ground electrode piercing terminal 5*b*, which will be described later, be used as piercing terminals.

Figure 14:
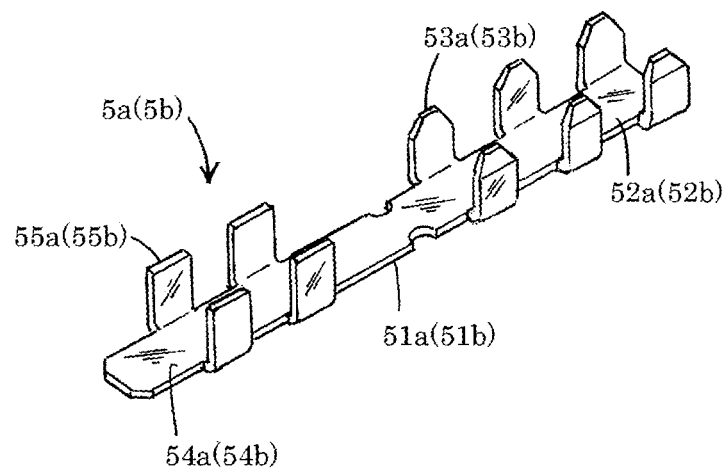
FIG. 14 is a perspective view illustrating a piercing terminal.

As shown in FIG. 14, the signal electrode piercing terminal 5*a* and the ground electrode piercing terminal 5*b* each include: a plate-shaped substrate 51*a*, 51*b* having a rectangular plane shape; a plurality of claws 53*a*, 53*b* provided in a protruding manner in the same direction at both edges in the width direction in a half 52*a*, 52*b* of the substrate 51*a*, 51*b*; and a plurality of gripping pieces 55*a*, 55*b* provided in a protruding manner in the same direction at both edges in the width direction in the other half 54*a*, 54*b* of the above-described substrate 51*a*, 51*b*. The claws 53*a*, 53*b* and the gripping pieces 55*a*, 55*b* of the signal electrode piercing terminal 5*a* and the ground electrode piercing terminal 5*b* are provided in a protruding manner in the same direction. The substrates 51*a*, 51*b*, the claws 53*a*, 53*b*, and the gripping pieces 55*a*, 55*b* of the signal electrode piercing terminal 5*a* and the ground electrode piercing terminal 5*b* have a conductive property. In FIG. 14, six claws 53*a*, 53*b* of the piercing terminal 5*a*, 5*b* are provided in a protruding manner, and four gripping pieces 55*a*, 55*b* are provided in a protruding manner. However, the numbers of the claws 53*a*, 53*b* and the gripping pieces 55*a*, 55*b* are not limited thereto.

Figure 15:
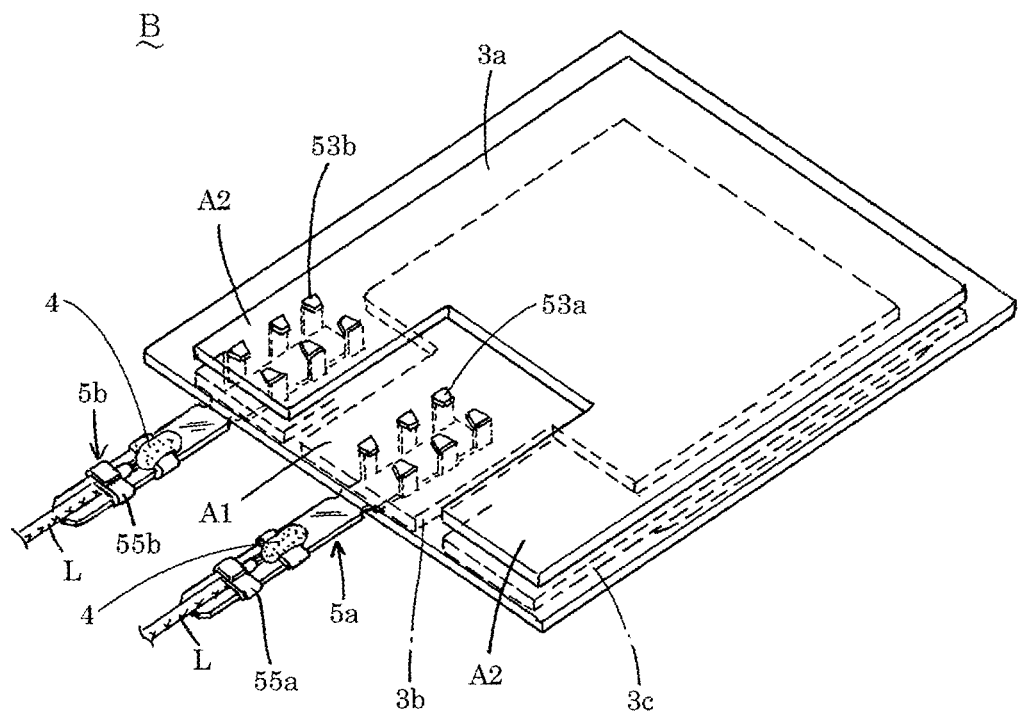
FIG. 15 is a perspective view illustrating another example of the piezoelectric sensor.
Figure 16:
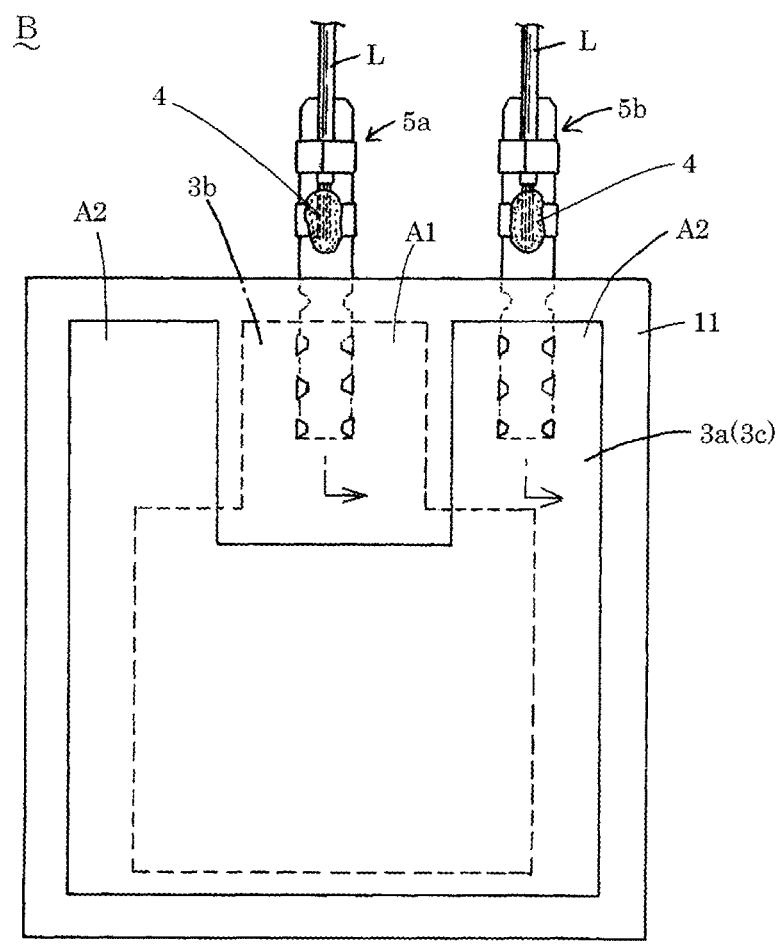
FIG. 16 is a plan view illustrating the piezoelectric sensor in FIG. 15.
Figure 17:
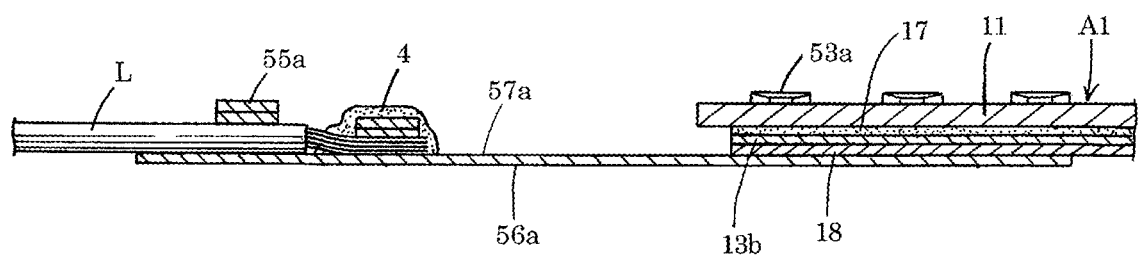
FIG. 17 is a longitudinal cross-sectional view of the piezoelectric sensor in FIG. 15 in a signal electrode connecting section.

As shown in FIGS. 15 to 17, the claws 53*a* of the signal electrode piercing terminal 5*a* are stuck into and passed through the signal electrode connecting section A1 of the piezoelectric sensor A in the thickness direction thereof. Bending tips of the claws 53*a* toward the piezoelectric sensor A achieves the fixing of the signal electrode piercing terminal 5a to the piezoelectric sensor A in the signal electrode connecting section A1. The signal electrode piercing terminal 5a and the signal electrode 13 are being electrically connected to each other. While FIGS. 15 to 17 show a case where the claws 53a of the signal electrode piercing terminal 5a are stuck into the piezoelectric sensor A from the side of the signal electrode 13 (the side of the second side 11B of the piezoelectric sheet 11), the claws 53a may be stuck thereinto from the side of the first side 11A of the piezoelectric sheet 11.

With the signal electrode piercing terminal 5a being fixed to the piezoelectric sensor A, part of the substrate 51a of the signal electrode piercing terminal 5a protrudes outward from the peripheral edge of the piezoelectric sheet 11 to form a protruded connecting section 56a. A surface of the protruded connecting section 56a of the signal electrode piercing terminal 5a in the protruding direction of the gripping piece 55a is formed as a conductive wire connecting surface 57a to be connected with a conductive wire L.

Figure 18:
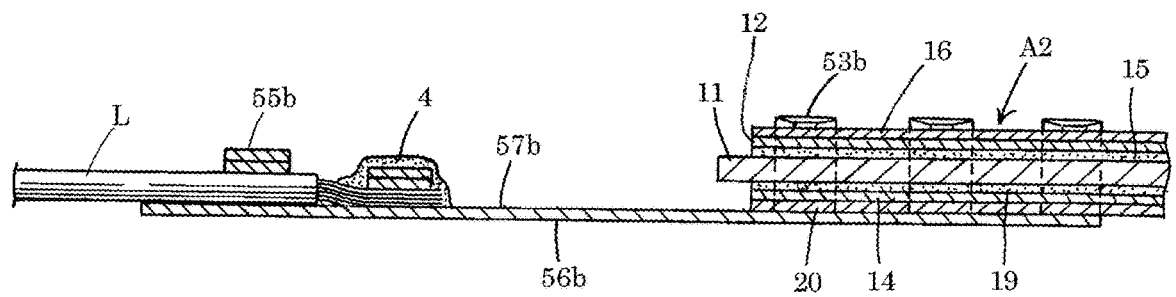
FIG. 18 is a longitudinal cross-sectional view of the piezoelectric sensor in FIG. 15 in a ground electrode connecting section.
Figure 19:
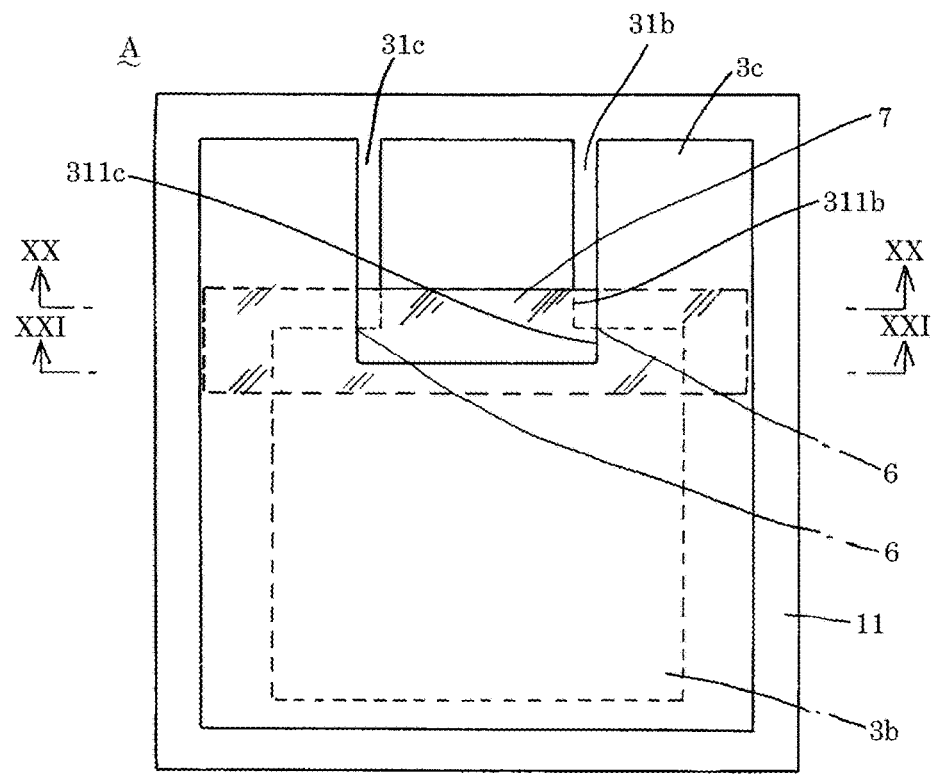
FIG. 19 is a plan view illustrating another example of the piezoelectric sensor.
Figure 20:
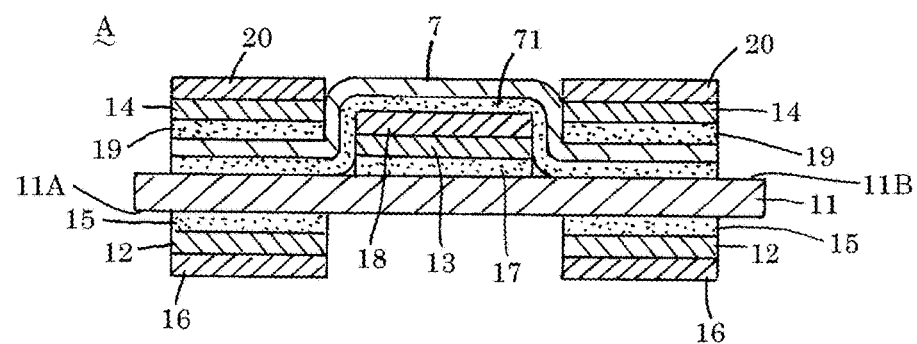
FIG. 20 is a cross-sectional view taken along line XX-XX in FIG. 19.
Figure 21:
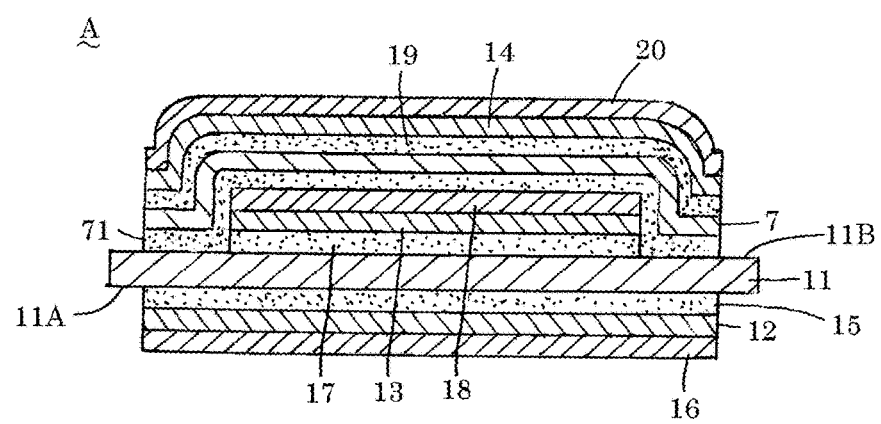
FIG. 21 is a cross-sectional view taken along line XXI-XXI in FIG. 19.
Figure 22:
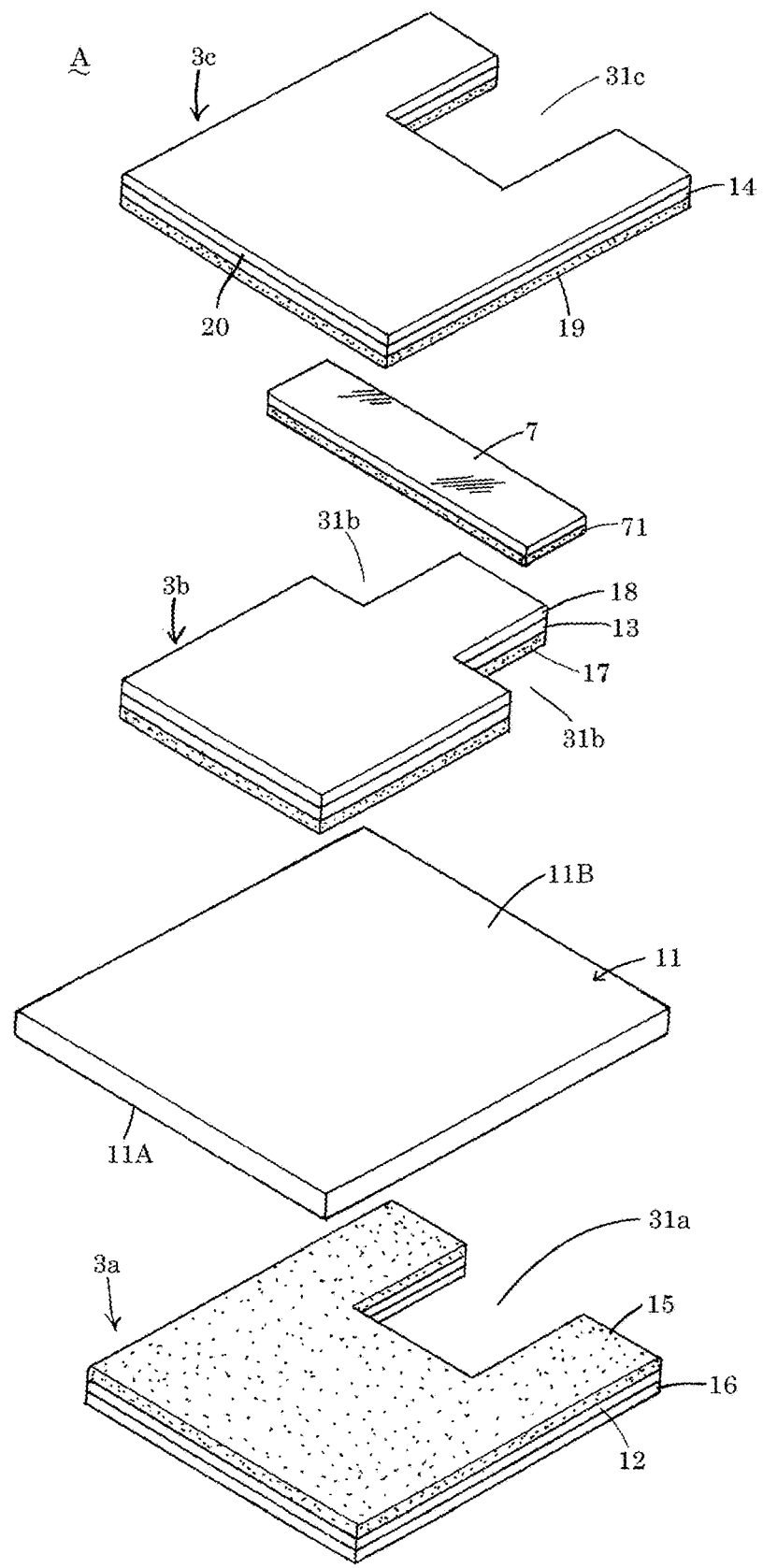
FIG. 22 is an exploded perspective view illustrating the piezoelectric sensor in FIG. 19.
Figure 23:
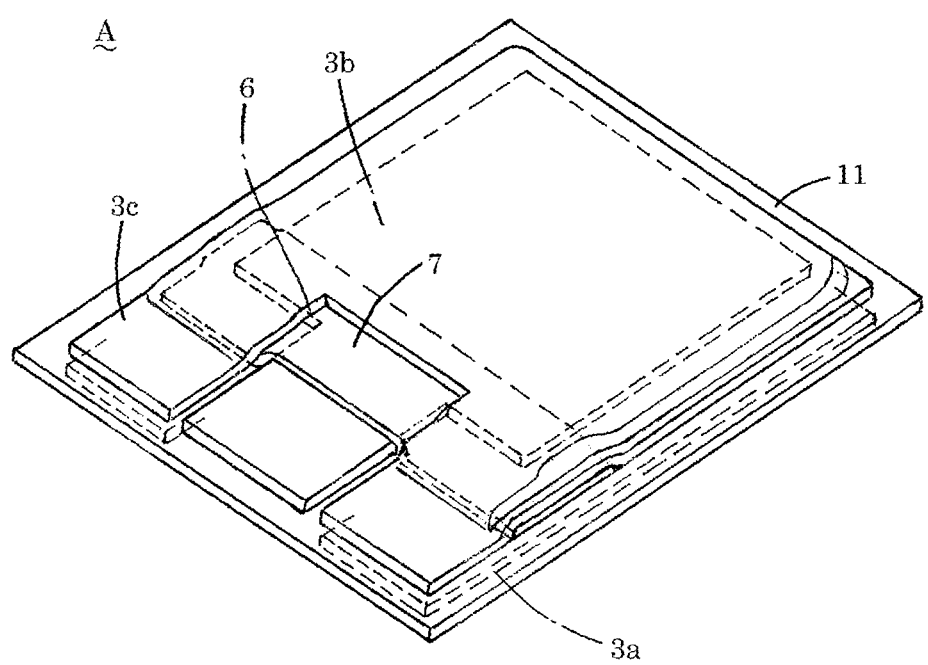
FIG. 23 is a perspective view illustrating the piezoelectric sensor in FIG. 19.

Moreover, as shown in FIG. 18, the claws 53b of the ground electrode piercing terminal 5b are stuck into and passed through either one of the ground electrode connecting sections A2 of the piezoelectric sensor A in the thickness direction thereof. Bending tips of the claws 53b toward the piezoelectric sensor A achieves the fixing of the ground electrode piercing terminal 5b to the piezoelectric sensor A in the ground electrode connecting section A2. The ground electrode piercing terminal 5b, the first ground electrode 12, and the second ground electrode 14 are being electrically connected to one another.

With the ground electrode piercing terminal 5b being fixed to the piezoelectric sensor A, part of the substrate 51b of the ground electrode piercing terminal 5b protrudes outward from the peripheral edge of the piezoelectric sheet 11 to form a protrusion 56b. A surface of the protrusion 56b of the ground electrode piercing terminal 5b in the protruding direction of the gripping piece 55b is formed as a conductive wire connecting surface 57b to be connected with a conductive wire L.

The conductive wires L, L are then electrically connected to the conductive wire connecting surface 57a of the signal electrode piercing terminal 5a and the conductive wire connecting surface 57b of the ground electrode piercing terminal 5b, respectively. Although the universal method can be employed to connect the conductive wires L, L to the conductive wire connecting surface 57a of the signal electrode piercing terminal 5a and the conductive wire connecting surface 57b of the ground electrode piercing terminal 5b, the use of solder 4 is preferable.

Furthermore, the gripping pieces 55a and 55b of the signal electrode piercing terminal 5a and the ground electrode piercing terminal 5b are bent over the conductive wire connecting surfaces 57a and 57b so as to grip and fix the conductive wires L, L.

As described above, the conductive wires L, L are electrically connected onto the conductive wire connecting surface 57a of the signal electrode piercing terminal 5a and the conductive wire connecting surface 57b of the ground electrode piercing terminal 5b with the solder 4 or the like. As shown in FIGS. 17 and 18, the conductive wire connecting surface 57a of the signal electrode piercing terminal 5a and the conductive wire connecting surface 57b of the ground electrode piercing terminal 5b are provided on the side of the piezoelectric sheet 11. Thus, if the conductive wires L, L are connected onto the conductive wire connecting surfaces 57a and 57b with the solder or the like, the thickness of the piezoelectric sensor A never equals the total thickness of the piezoelectric sheet 11 and the solder 4. Only a portion of the thickness of the solder 4 exceeding the thickness of the piezoelectric sheet 11 leads to an increase in the thickness of the piezoelectric sensor A. Thus, the thickness of the piezoelectric sensor A can be reduced.

Furthermore, the conductive wires L, L are connected to the conductive wire connecting surfaces 57a and 57b formed in the protrusions 56a and 56b of the signal electrode piercing terminal 5a and the ground electrode piercing terminal 5b with the solder or the like as described above. When the conductive wires L, L are connected with the solder, for example, heat is applied to the protrusions 56a and 56b of the signal electrode piercing terminal 5a and the ground electrode piercing terminal 5b in order to melt the solder. However, the protrusions 56a and 56b of the signal electrode piercing terminal 5a and the ground electrode piercing terminal 5b are protruded outward from the peripheral edge of the piezoelectric sheet 11 so that an amount of heat transferred to the piezoelectric sheet 11 can be reduced, which in turn can reduce the occurrence of heat damage in the piezoelectric sheet 11.

Moreover, when the conductive wires L, L are connected and fixed to the conductive wire connecting surfaces 57a and 57b of the signal electrode piercing terminal 5a and the ground electrode piercing terminal 5b with the solder, the protrusions 56a and 56b of the signal electrode piercing terminal 5a and the ground electrode piercing terminal 5b may be placed on a plate having high heat conductivity such as a metal plate. By doing so, heat applied to the protrusions 56a and 56b of the signal electrode piercing terminal 5a and the ground electrode piercing terminal 5b can be released into the plate having high heat conductivity to reduce an amount of heat transferred to the piezoelectric sheet 11, which in turn can reduce the occurrence of heat damage in the piezoelectric sheet 11 more reliably.

To use the piezoelectric sensor A, the first ground electrode 12 is set as a reference electrode by grounding the first ground electrode 12 by the intermediary of the conductive wire L connected to the first ground electrode 12 by the intermediary of the ground electrode piercing terminal 5b. A potential generated in the piezoelectric sheet 11 can be drawn out through the signal electrode 13 and the signal electrode piercing terminal 5a with the first ground electrode 12 used as a reference electrode.

In the above-described piezoelectric sensor A, the peripheral edge of the piezoelectric sheet 11 protrudes outward from the region occupied by the first ground electrode 12, the second ground electrode 14, and the cutout sections 12a and 14a as viewed in the thickness direction of the piezoelectric sheet 11. As shown in FIGS. 6 to 9, the region occupied by the first ground electrode 12, the second ground electrode 14, and the cutout sections 12a and 14a and the piezoelectric sheet 11 may be formed in the same shape and the same size as viewed in the thickness direction of the piezoelectric sheet 11, and the peripheral edge of the piezoelectric sheet 11 may not protrude outward from the region occupied by the first ground electrode 12, the second ground electrode 14, and the cutout sections 12a and 14a. Note that structures same as those in the piezoelectric sensor of FIG. 1 will be denoted by the same reference numerals and the description thereof will be omitted.

Figure 10:
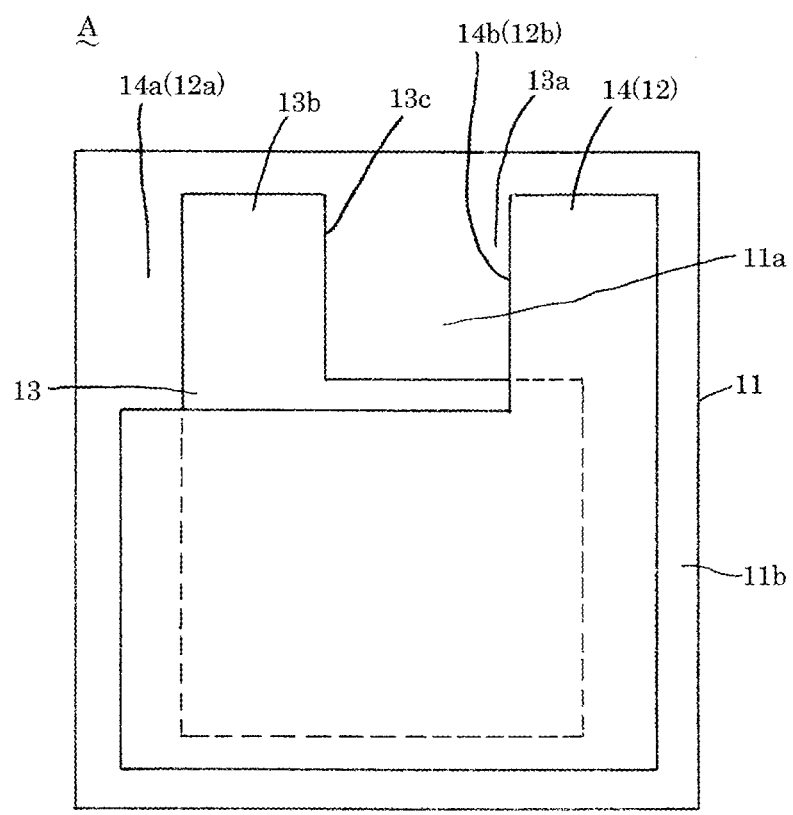
FIG. 10 is a plan view illustrating another example of the piezoelectric sensor of the present invention.
Figure 11:
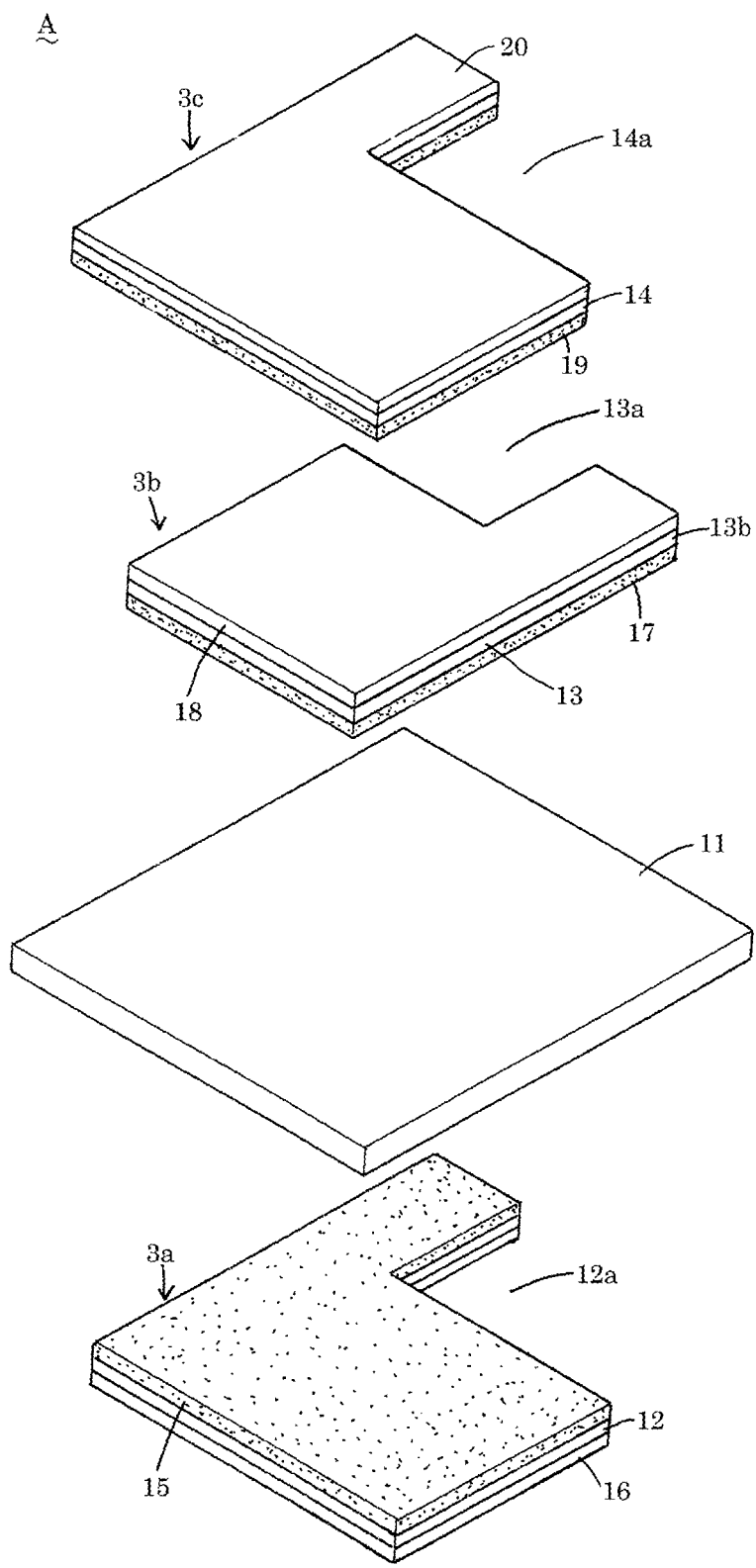
FIG. 11 is an exploded perspective view of the piezoelectric sensor in FIG. 10.

The shapes of the first ground electrode 12, the first electrical insulation sheet 16, the first fixative layer 15, the second ground electrode 14, the second electrical insulation sheet 20, the second fixative layer 19, the signal electrode 13, the third electrical insulation sheet 20, and the third fixative layer 19 are not limited to the above-described shapes. As shown in FIGS. 10 and 11, the first ground electrode 12 and the second ground electrode 14 are each formed in a generally-rectangular plane shape. Cutout sections 12a and 14a are each formed by cutting out any one corner in a rectangular shape. With the first ground electrode 12 being integrally laminated on the first side 11A of the piezoelectric sheet 11 and the second ground electrode 14 being integrally laminated on the second side 11B of the piezoelectric sheet 11, the first cutout section 12a formed in the first ground electrode 12 and the second cutout section 14a formed in the second ground electrode 14 are configured so as to partially or entirely overlap with each other.

Furthermore, the signal electrode 13 has a size smaller than a region occupied by the first ground electrode 12, the second ground electrode 14, the first cutout section 12a, and the second cutout section 14a as viewed in the thickness direction of the piezoelectric sheet 11. The signal electrode 13 is formed in a generally-rectangular plane shape. The signal electrode 13 has a third cutout section 13a formed by cutting out any one corner in a rectangular shape. A corner adjacent to the third cutout section 13a serves as a protrusion 13b. With the signal electrode 13 being integrally laminated on the second side 11B of the piezoelectric sheet 11, the first cutout section 12a of the first ground electrode 12, the second cutout section 14a of the second ground electrode 14, and the cutout section 13a of the signal electrode 13 are partially overlapped with one another as viewed in the thickness direction of the piezoelectric sheet 11. As viewed in the thickness direction of the piezoelectric sheet 11, the protrusion 13b of the signal electrode 13 is accommodated in the cutout section 12a of the first ground electrode 12 and the cutout section 14a of the second ground electrode 14. Gaps are formed between edges 12b and 14b of the cutout sections 12a and 14a of the first and second ground electrodes 12 and 14 and a peripheral edge 13c of the protrusion 13b of the signal electrode 13. Part of the piezoelectric sheet 11 is exposed through the above-described gaps in a state in contact with the ambient air without being covered by the first and second ground electrodes 12 and 14, the signal electrode 13, the electrical insulation sheets 16, 18, and 20, and the fixative layers 15, 17, and 19. Such an exposed portion serves as an exposed section 11a. Note that the entire signal electrode 13 is arranged within the region occupied by the first and second ground electrodes 12 and 14 and their cutout sections 12a and 14a as viewed in the thickness direction of the piezoelectric sheet 11. As viewed in the thickness direction of the piezoelectric sheet 11, the first electrical insulation sheet 16, the first ground electrode 12, and the first fixative layer 15 are formed in the same shape and the same size; the third electrical insulation sheet 18, the signal electrode 13, and the third fixative layer 17 are formed in the same shape and the same size; and the second electrical insulation sheet 20, the second ground electrode 14, and the second fixative layer 19 are formed in the same shape and the same size. A description of the components same as those in the piezoelectric sensors shown in FIGS. 1 to 9 will be omitted.

In the above-described piezoelectric sensor A, the case where the first and second ground electrodes 12 and 14 and the signal electrode 13 each have a generally-rectangular plane shape has been described. However, there is no need for the plane shapes of the first and second ground electrodes 12 and 14 and the signal electrode 13 to be rectangular shapes. For example, a polygonal shape other than a rectangle, such as a triangle, a pentagon, or a hexagon, or a circular shape such as an oval or a perfect circle may be employed.

A method of manufacturing the above-described piezoelectric sensor A will be described next. Examples of a method of manufacturing the piezoelectric sensor A of the present invention include manufacturing by adhesively integrating electrode sheets 3 with the respective sides of the piezoelectric sheet 11.

Figure 12:
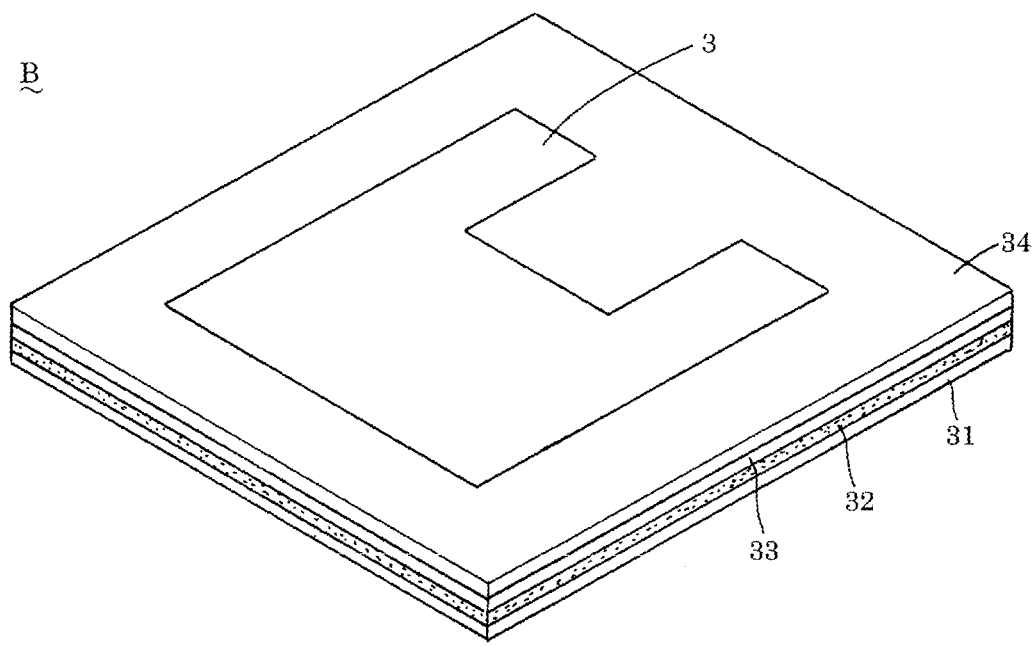
FIG. 12 is a perspective view illustrating a manufacturing process of an electrode sheet.
Figure 13:
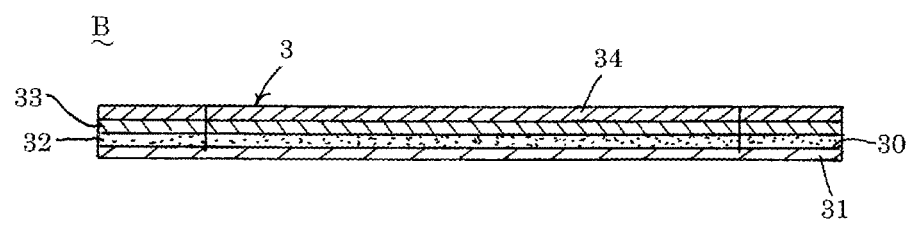
FIG. 13 is a cross-sectional view illustrating the manufacturing process of the electrode sheet.

For the electrode sheet 3, a layered sheet B is manufactured by layering a pressure sensitive adhesive layer 32 to be a fixative layer, an electrode layer 33 to be an electrode, and an electrical insulation sheet 34 so as to be integrally laminated with one another in this order on a releasing treatment surface 30 of a base sheet 31 formed, for example, by a synthetic resin sheet having a first side subjected to a releasing treatment as shown in FIGS. 12 and 13. Note that the releasing treatment surface 30 of the base sheet 31 and the pressure sensitive adhesive layer 32 are layered on each other in a peelable manner. The electrode layer 33 may be integrally laminated on the electrical insulation sheet 34 by the intermediary of a pressure sensitive adhesive layer (not shown).

Thereafter, the layered sheet B is cut into a desired shape with a cutting blade from the side of the electrical insulation sheet 34 toward the base sheet 31. At this time, the base sheet 31 may or may not be cut. In this manner, the electrode sheet 3 having a desired shape in which the fixative layer, the electrode, and the electrical insulation sheet are integrally laminated with one another is manufactured for each of the ground electrodes and the signal electrode. Note that the electrode sheet 3 is used after the base sheet is peeled off and removed from the surface of the fixative layer. FIG. 12 shows a case where a ground electrode sheet is formed.

In a first ground electrode sheet 3a, the first electrical insulation sheet 16, the first ground electrode 12, and the first fixative layer 15 are integrally laminated with one another in this order, and the first electrical insulation sheet 16, the first ground electrode 12, and the first fixative layer 15 are all formed in the same shape and the same size. Then, the first ground electrode sheet 3a is adhesively integrated with the first side 11A of the piezoelectric sheet 11 by the first fixative layer 15. Consequently, the first ground electrode 12 is integrally laminated on the first side 11A of the piezoelectric sheet 1 (see FIGS. 4, 5, and 19 to 23). The first ground electrode sheet 3a is formed in a generally-rectangular plane shape. In a portion of a rectangular shape other than four corners thereof, the first ground electrode sheet 3a has a fourth cutout section 31a having a rectangular plane shape opened to a peripheral edge of the rectangular shape.

In a signal electrode sheet 3b, the third electrical insulation sheet 18, the signal electrode 13, and the third fixative layer 17 are integrally laminated with one another in this order, and the third electrical insulation sheet 18, the signal electrode 13, and the third fixative layer 17 are all formed in the same shape and the same size. Then, the signal electrode sheet 3b is adhesively integrated with the second side 11B of the piezoelectric sheet 11 by the third fixative layer 17. Consequently, the signal electrode 13 is integrally laminated on the second side 11B of the piezoelectric sheet 11 (see FIGS. 4, 5, and 19 to 23). The signal electrode sheet 3b is formed in a generally-rectangular plane shape. The signal electrode sheet 3b has fifth cutout sections 31b, 31b formed by cutting out a pair of adjacent corners in a rectangular shape.

In a second ground electrode sheet 3c, the second electrical insulation sheet 20, the second ground electrode 14, and the second fixative layer 19 are integrally laminated with one another in this order, and the second electrical insulation sheet 20, the second ground electrode 14, and the second fixative layer 19 are all formed in the same shape and the same size. Then, the second ground electrode sheet 3c is adhesively integrated with the signal electrode sheet 3b by the second fixative layer 19. Consequently, the first ground electrode 12 is integrally laminated on the signal electrode sheet 3b, and the piezoelectric sensor A is thus formed (see FIGS. 4, 5, and 19 to 23). The second ground electrode sheet 3c is formed in a generally-rectangular plane shape. In a portion of a rectangular shape other than four corners thereof, the second ground electrode sheet 3c has a sixth cutout section 31c having a rectangular plane shape opened to a peripheral edge of the rectangular shape.

The signal electrode sheet 3b and the second ground electrode sheet 3c, on the other hand, are manufactured as described above by: preparing the layered sheet B in which the pressure sensitive adhesive layer 32 to be a fixative layer, the electrode layer 33 to be an electrode, and the electrical insulation sheet 34 are integrally laminated with one another in this order on the releasing treatment surface of the base sheet; and cutting the pressure sensitive adhesive layer 32, the electrode layer 33, and the electrical insulation sheet 34 of the layered sheet B into a desired shape with the cutting blade from the side of the electrical insulation sheet 34 toward the base sheet 31.

However, upon manufacturing the electrode sheet by cutting the layered sheet B with the cutting blade, shearing stress from the cutting blade is applied to the electrode layer in the thickness direction thereof. The electrode layer of the layered sheet is often formed from a relatively soft material. Thus, the cut electrode layer, i.e., part of the electrode may be stretched by the shearing stress from the cutting blade and attached to the cut surface of the layered sheet, i.e., the cut end face of the obtained electrode sheet.

If part of the electrode is attached to the cut end face of the electrode sheet, in a portion where the cut end face of the signal electrode sheet intersects with the cut end face of the second ground electrode sheet between the signal electrode sheet and the second ground electrode sheet arranged adjacent to each other, there is a risk of developing a short circuit between the signal electrode attached to the cut end face of the signal electrode sheet and the second ground electrode attached to the cut end face of the second ground electrode sheet. If a short circuit is developed between the signal electrode attached to the cut end face of the signal electrode sheet and the second ground electrode attached to the cut end face of the second ground electrode sheet, a potential generated in the piezoelectric sheet 11 cannot be drawn out through the signal electrode.

In view of this, an electrical insulation sheet 7 is interposed between the signal electrode sheet 3b and the second ground electrode sheet 3c in a portion 6 where a cut end face 311b of the fifth cutout section 31b of the signal electrode sheet 3b intersects with a cut end face 311c of the sixth cutout section 31c of the second ground electrode sheet 3c, so that a short circuit is prevented from developing between the signal electrode 13 attached to the cut end face of the signal electrode sheet 3b and the second ground electrode 14 attached to the cut end face of the second ground electrode sheet 3c. It is only necessary that the electrical insulation sheet 7 is interposed at least in the portion 6 where the cut end face of the signal electrode sheet 3b intersects with the cut end face of the second ground electrode sheet 3c. The electrical insulation sheet 7 may be interposed in an area including the portion 6 where the cut end face of the signal electrode sheet 3b intersects with the cut end face of the second ground electrode sheet 3c and the vicinity of the intersecting portion 6.

The above-described electrical insulation sheet 7 is not limited to a particular sheet so long as it has an electrical insulation property. Examples of the electrical insulation sheet 7 include a polyethylene terephthalate sheet, a polyethylene naphthalate sheet, and a polyvinyl chloride sheet.

Alternatively, a pressure sensitive adhesive 71 may be integrally laminated on one side of the electrical insulation sheet 7 and then the pressure sensitive adhesive 71 may be adhesively integrated with either one of the signal electrode sheet 3b or the second ground electrode sheet 3c. Note that a preferred pressure sensitive adhesive is a fixative having a low dielectric constant from the perspective of maintaining the sensitivity of the piezoelectric sheet 11.

Part or all of the above-described piezoelectric sensor A, signal electrode piercing terminal 5a, ground electrode piercing terminal 5b and conductive wire L shown in FIGS. 1 to 23 may be covered by a known electromagnetic shield. The conductive wire L connected to the ground electrode piercing terminal 5b and/or the ground electrode piercing terminal 5b is electrically connected to the electron-wave shield. The electromagnetic shield can further prevent the piezoelectric sensor A from receiving the influence of electromagnetic waves from the outside. Such an electromagnetic shield is not limited to a particular electromagnetic shield, and examples thereof include a metal housing and metallic foil. When the piezoelectric sensor A is covered by the electromagnetic shield, the exposed section 11a of the piezoelectric sensor A needs to be kept in contact with the ambient air.

CROSS-REFERENCE TO RELATED APPLICATIONS

The present application claims the priority benefits of Japanese Patent Application No. 2013-144211 filed on Jul. 10, 2013, Japanese Patent Application No. 2013-144215 filed on Jul. 10, 2013, and Japanese Patent Application No. 2013-203029 filed on Sep. 30, 2013, the entire disclosures of which are incorporated herein by reference.

INDUSTRIAL APPLICABILITY

The piezoelectric sensor of the present invention can maintain an excellent piezoelectric property over a long period and can be used as a vital sensor for detecting vital signals such as pulse waves, respirations, and body motions, or a sensor for detecting traffic of automobiles, bicycles, and people.

REFERENCE SIGNS LIST 3 electrode sheet
3a first ground electrode sheet
3b signal electrode sheet
3c second ground electrode sheet
5a signal electrode piercing terminal
5b ground electrode piercing terminal
7 electrical insulation sheet
11 piezoelectric sheet
11a exposed section
11b exposed protrusion
12 first ground electrode
13 signal electrode
13b protrusion
14 second ground electrode
15, 17, 19 fixative layer
16, 18, 20 electrical insulation sheet A piezoelectric sensor
A1 signal electrode connecting section
A2 ground electrode connecting section

The invention claimed is:

1. A piezoelectric sensor comprising:
a piezoelectric sheet;
a first ground electrode integrally laminated on a first side of the piezoelectric sheet and having a first cutout section;
a signal electrode integrally laminated on a second side of the piezoelectric sheet and having a third cutout section; and
a second ground electrode integrally laminated on the signal electrode so as to be electrically insulated from the signal electrode and having a second cutout section, wherein
the cutout sections of the signal electrode, the first ground electrode, and the second ground electrode are at least partially overlapped with one another in a thickness direction of the piezoelectric sheet, and
a portion of the piezoelectric sheet exposed through a portion where the cutout sections of the signal electrode, the first ground electrode, and the second ground electrode are overlapped with one another in the thickness direction of the piezoelectric sheet serves as an exposed section, wherein:
the second ground electrode is integrally laminated on the second side of the piezoelectric sheet by adhesively integrating a second ground electrode sheet, formed by integrally laminating a second electrical insulation sheet, the second ground electrode, and a second fixative layer with one another in this order, with the second side of the piezoelectric sheet by the second fixative layer;
the signal electrode is integrally laminated on the signal electrode by adhesively integrating a signal electrode sheet, formed by integrally laminating a third electrical insulation sheet, the signal electrode, and a third fixative layer with one another in this order, with the second ground electrode sheet by the third fixative layer; and
a fourth electrical insulation sheet is interposed between the signal electrode sheet and the second ground electrode sheet in a portion where an end face of the signal electrode sheet intersects with an end face of the second ground electrode sheet.

2. The piezoelectric sensor according to claim 1, wherein the first ground electrode has the first cutout section opened to an edge thereof, the second ground electrode has the second cutout section opened to an edge thereof, and the signal electrode has the third cutout section opened to an edge thereof.

3. The piezoelectric sensor according to claim 1, wherein the first ground electrode and the second ground electrode have the first cutout section and the second cutout section, respectively, opened to an edge excluding a corner of a rectangular plane shape, and the signal electrode has the third cutout sections formed by cutting out a pair of adjacent corners in a rectangular plane shape and has a protrusion formed between the third cutout sections.

4. The piezoelectric sensor according to claim 1, wherein a peripheral end of the piezoelectric sheet protrudes outward from a region occupied by the signal electrode, the first ground electrode, and the second ground electrode as viewed in the thickness direction of the piezoelectric sheet, and the protruded portion serves as an exposed protrusion of the piezoelectric sheet.

5. The piezoelectric sensor according to claim 1, wherein:
the signal electrode sheet is formed by cutting a layered sheet, formed by integrally laminating a pressure sensitive adhesive layer, a signal electrode layer, and an electrical insulation sheet with one another in this order, with a cutting blade from the side of the electrical insulation sheet toward the pressure sensitive adhesive layer; and
the second ground electrode sheet is formed by cutting a layered sheet, formed by integrally laminating a pressure sensitive adhesive layer, a second ground electrode layer, and an electrical insulation sheet with one another in this order, with a cutting blade from the side of the electrical insulation sheet toward the pressure sensitive adhesive layer.

6. The piezoelectric sensor according to claim 1, wherein the signal electrode sheet has a fourth cutout section, the second ground electrode sheet has a fifth cutout section, an end face of the fourth cutout section intersects with an end face of the fifth cutout section, and the fourth electrical insulation sheet is interposed between the signal electrode sheet and the second ground electrode sheet in this intersecting portion.

7. A piezoelectric sensor comprising:
a piezoelectric sheet
a first ground electrode integrally laminated on a first side of the piezoelectric sheet and having a first cutout section;
a signal electrode integrally laminated on a second side of the piezoelectric sheet and having a third cutout section; and
a second ground electrode integrally laminated on the signal electrode so as to be electrically insulated from the signal electrode and having a second cutout section, wherein
the cutout sections of the signal electrode, the first ground electrode, and the second ground electrode are at least partially overlapped with one another in a thickness direction of the piezoelectric sheet, and
a portion of the piezoelectric sheet exposed through a portion where the cutout sections of the signal electrode, the first ground electrode, and the second ground electrode are overlapped with one another in the thickness direction of the piezoelectric sheet serves as an exposed section, wherein:
the first cutout section of the first ground electrode, the second cutout section of the second ground electrode, and part of the signal electrode are at least partially overlapped with one another in the thickness direction of the piezoelectric sheet and this overlapped portion serves as a signal electrode connecting section;
the third cutout section of the signal electrode, part of the first ground electrode, and part of the second ground electrode are at least partially overlapped with one another in the thickness direction of the piezoelectric sheet and this overlapped portion serves as a ground electrode connecting section; and
the piezoelectric sensor further comprises:
a signal electrode piercing terminal having a claw stuck into the signal electrode connecting section so as to be electrically connected to the signal electrode and a protruded connecting section protruding outward from a peripheral edge of the piezoelectric sheet, and
a ground electrode piercing terminal having a claw stuck into the ground electrode connecting section so as to be electrically connected to the first ground electrode and the second ground electrode and a protruded connecting section protruding outward from the peripheral edge of the piezoelectric sheet.

8. The piezoelectric sensor according to claim 7, wherein surfaces of the protruded connecting sections in the signal electrode piercing terminal and the ground electrode piercing terminal closer to the piezoelectric sheet each serve as a conductive wire connecting surface to be connected with a conductive wire.

9. The piezoelectric sensor according to claim 7, wherein the protruded connecting sections in the signal electrode piercing terminal and the ground electrode piercing terminal are each provided with an gripping piece for gripping a conductive wire connected to a conductive wire connecting surface.

* * * * *